United States Patent [19]

McClurg

[11] Patent Number: 5,300,806
[45] Date of Patent: Apr. 5, 1994

[54] SEPARATION OF DIODE ARRAY CHIPS DURING FABRICATION THEREOF

[75] Inventor: Scott D. McClurg, Rochester, N.Y.

[73] Assignee: Eastman Kodak Company, Rochester, N.Y.

[21] Appl. No.: 662,865

[22] Filed: Mar. 1, 1991

Related U.S. Application Data

[62] Division of Ser. No. 439,919, Nov. 21, 1989, Pat. No. 4,997,792.

[51] Int. Cl.⁵ .................... H01L 33/00; H01L 29/06; H01L 27/10
[52] U.S. Cl. ..................... 257/594; 257/79; 257/88; 257/622; 257/797
[58] Field of Search ........ 357/17; 257/79, 88, 257/594, 622, 797

[56] References Cited

U.S. PATENT DOCUMENTS

| | | | |
|---|---|---|---|
| 3,883,887 | 5/1975 | Robinson, Sr. | 357/17 |
| 4,011,575 | 3/1977 | Groves | 357/17 |
| 4,068,788 | 1/1978 | Guhilose et al. | |
| 4,175,684 | 11/1979 | Butler | |
| 4,231,503 | 11/1980 | Butler | |
| 4,241,281 | 12/1980 | Morimoto et al. | 357/17 |
| 4,256,246 | 3/1981 | Kindel | |
| 4,355,457 | 10/1982 | Barlett et al. | |
| 4,447,825 | 5/1984 | Dana et al. | 357/17 |
| 4,485,377 | 11/1984 | Claus et al. | 357/17 |
| 4,596,998 | 6/1986 | Krimmel | 357/17 |
| 4,604,161 | 8/1986 | Araghi | |
| 4,605,944 | 8/1986 | Ishii et al. | |
| 4,610,079 | 9/1986 | Abe et al. | |
| 4,668,333 | 5/1987 | Tandon et al. | |
| 4,814,296 | 3/1989 | Jedlicka et al. | |
| 4,822,755 | 4/1989 | Hawkins et al. | |
| 4,868,616 | 9/1989 | Johnson et al. | 357/17 |
| 4,900,283 | 2/1990 | Fukae | |
| 4,904,617 | 2/1990 | Muschke | |

FOREIGN PATENT DOCUMENTS

| | | |
|---|---|---|
| 3731312 | 3/1989 | Fed. Rep. of Germany |
| 1566090 | 3/1988 | France |
| 60-20590 | 2/1985 | Japan |
| 60-144985 | 7/1985 | Japan |
| 60-216565 | 10/1985 | Japan |
| 61-64176 | 4/1986 | Japan |
| 63-92026 | 4/1988 | Japan |

*Primary Examiner*—Ngan Ngo
*Attorney, Agent, or Firm*—Norman Rushefsky

[57] ABSTRACT

Rather than being separated along a single cleavage line between their adjacent ends, diode arrays are spaced apart on a fabrication wafer to allow parallel cleavage lines to be established between the ends of each adjacent pair of arrays by scribed grooves located along opposite sides of a narrow disposable strip of wafer material. A cleaving technique substantially insures that any projecting lip along the cleavage plane will be on the disposable strip rather than on a diode chip, so that such a defect cannot interfere with proper end-to-end spacing of the chips when they are subsequently assembled to provide a continuous row of chips with uniformly spaced individual light-emitting sites.

10 Claims, 2 Drawing Sheets

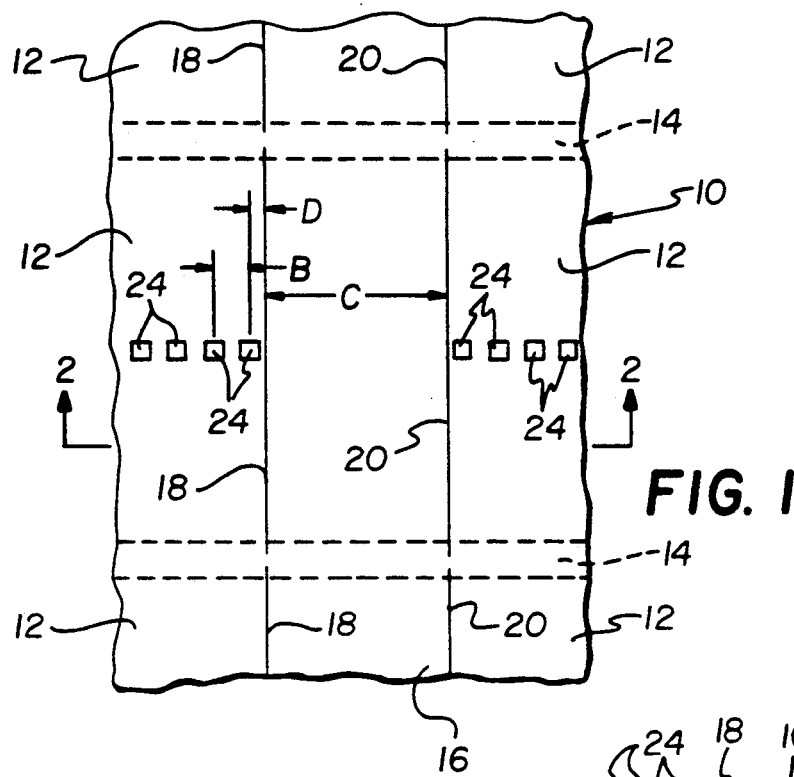
FIG. 1
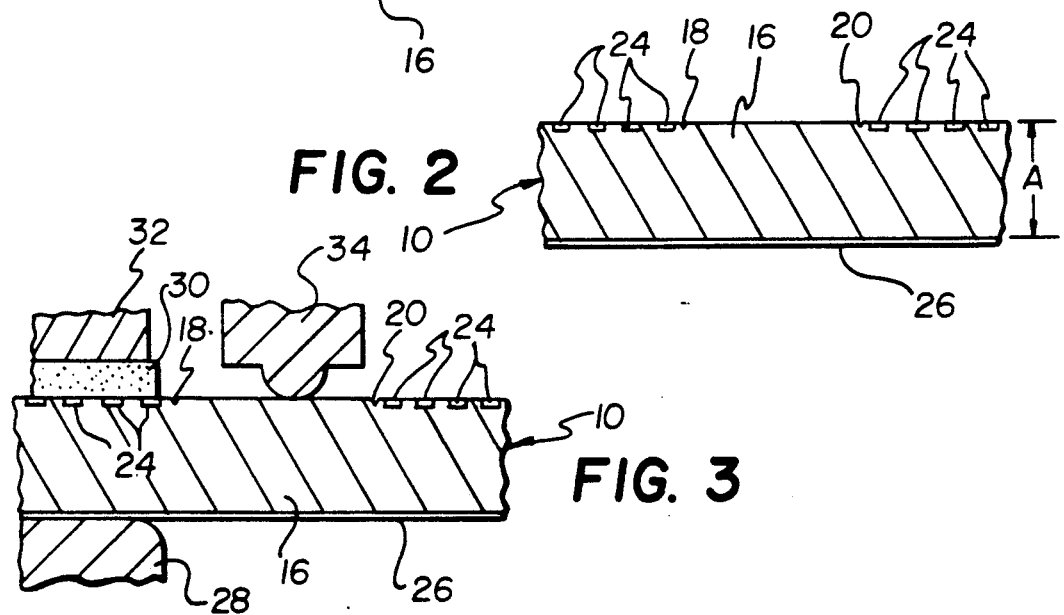
FIG. 2
FIG. 3
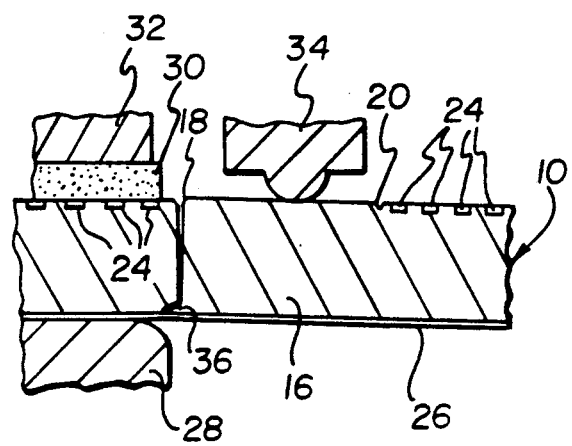
FIG. 4

SEPARATION OF DIODE ARRAY CHIPS DURING FABRICATION THEREOF

CROSS-REFERENCE TO A RELATED APPLICATION

This is a divisional of application Ser. No. 07/439,919, filed Nov. 21, 1989, now U.S. Pat. No. 4,997,792, issued Mar. 5, 1991.

Reference is made to commonly assigned U.S. Pat. No. 4,997,793 and entitled "Method of Improving Cleaving of Diode Arrays" and to U.S. Pat. No. 5,053,836 and entitled "Cleaving of Diode Arrays With Scribing Channels" both filed in the name of Scott Douglas McClurg.

BACKGROUND OF THE INVENTION

1. Field of the Invention

The present invention relates to diode arrays and, more particularly, to means for separating individual diode array chips from a fabrication wafer.

2. Description Relative to the Prior Art

Light-emitting diode (LED) array chips are made in the same way as are many other types of solid state chip devices, by forming a large number of identical rectangular shaped array areas in rows and columns on a substrate wafer and then subsequently sawing or cleaving the wafer between the rows and columns to separate it into individual chips. An LED array chip is provided with a central row of uniformly spaced light-emitting sites and is subsequently mounted in end-to-end relation with other identical chips to produce an array assemblage with a continuous row of uniformly spaced light-emitting sites. The light-emitting sites of such an array may have a density of 200 or more per centimeter with a typical array assemblage being 25 centimeters or more in length. In order that the spacing between the diode sites at the ends of adjacent chips will be the same as that between the other diode sites, the ends of the chips must extend beyond the adjacent endmost diode sites by no more than half the distance between such sites along the chips, but must not encroach upon the endmost sites. For example, if the spacing between adjacent diode sites is 20 μm, this means that the end of each chip must be not more than 10 μm beyond the adjacent endmost diode site, but must be spaced from that site sufficiently to prevent a threat of physical damage to the site. Because of this demanding tolerance, sawing techniques have proven insufficiently accurate to define the ends of the diode array chips without resort to expensive subsequent lapping operations or the like. Sufficient dimensional accuracy can be achieved without secondary operations by scribing a cleavage groove on the wafer and then cleaving it along the cleavage plane established by scribed groove, and machines for carrying out this process are commercially available.

Various different techniques are commonly employed to cleave the wafer; for example, striking a knife-like edge positioned along the cleavage groove; inducing a bending force in the wafer at opposite sides of the cleavage groove by resiliently supporting the back face of the wafer and by pressing on the top face at opposite sides of the scribe line with a resilient roller or platen; or clamping the wafer at one side of the groove and applying a bending force beyond the groove to induce cleavage. The resulting fractured edge of the wafer can be very precisely located, but, in many cases, a small ledge or lip will be formed at the edge of the fracture opposite the scribe line, projecting beyond the cleavage plane sufficiently to prevent end-to-end positioning of the chips. Because the cleaving forces exerted on the chip by the foregoing techniques are generally symmetrical relative to the cleavage line, such a ledge or lip can occur on either of the two fracture faces. Such a lip or projection can be removed by a subsequent lapping operation or the occurrence of this phenomenon can be reduced by sawing a groove or channel along the back face of the wafer in the cleaving area, but such operations obviously add to the production costs.

SUMMARY OF THE INVENTION

The present invention employs a cleaving technique which does not necessarily eliminate the formation of a lip or projection along the lower edge of one of the separated chips, but which allows accurate prediction of which chip edge, if any, will have such a flaw. Based on this ability to control the location of the unwanted lip or projection, the invention further contemplates spacing the adjacent columns of chips on a wafer by a distance sufficient to allow parallel cleavage grooves to be scribed between the ends of each adjacent pair of arrays along opposite sides of a narrow disposable strip of wafer material. The cleaving technique employed imparts asymmetrical cleavage forces to the wafer along the cleavage grooves to substantially insure that any lip or projection along the cleavage plane will be on the disposable strip rather than on the LED chip. Accordingly, any such defect cannot interfere with the proper end-to-end spacing of the chips when they are subsequently assembled to provide a continuous row of chips with uniformly spaced individual light-emitting sites.

Various means for practicing the invention and other advantages and novel features thereof will be apparent from the following description of illustrative preferred embodiments of the invention reference being made to the accompanying drawings.

BRIEF DESCRIPTION OF THE DRAWINGS

FIG. 1 is a somewhat schematic fragmentary plan view of the upper face of a portion of the fabrication wafer including a plurality of rectangular LED array chip arrays located in rows and columns, depicting the separation of two adjacent columns of array areas by two spaced parallel scribe grooves in accordance with the present invention;

FIG. 2 is a cross-sectional view along line 2—2 of FIG. 1;

FIG. 3 corresponds to FIG. 2 and shows a cleaving device positioned in preparation for cleaving the wafer along one of the depicted scribe grooves;

FIG. 4 corresponds to FIG. 3 and shows the wafer after it has been cleaved;

DESCRIPTION OF THE ILLUSTRATIVE PREFERRED EMBODIMENTS

Figure 5:
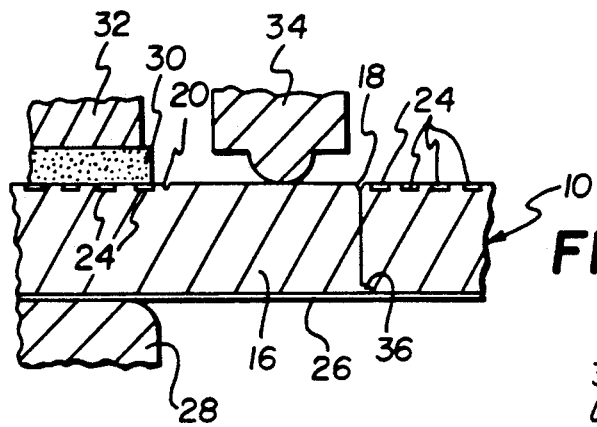
FIG. 5 is similar to FIG. 3 but shows the wafer reversed to position the other illustrated scribe groove in position for cleaving.

FIG. 1 depicts, somewhat schematically, an enlarged portion of an LED array fabrication wafer 10 on which individual LED array areas 12 are located in rows separated by sawing regions 14 (shown in broken lines) and in columns separated by disposable wafer strips 16 defined by corresponding pairs of spaced scribed cleavage grooves 18 and 20. Each of the LED array areas includes, along its longitudinal center line, a row of uniformly spaced light-emitting diode sites 24.

FIG. 2 is a cross-sectional view showing the two cleavage grooves 18 and 20 at opposite sides of the corresponding disposable strip region 16 and illustrating the location of the individual LED sites 24 at the corresponding ends of the illustrated LED array areas. The thickness (A) of a typical wafer of this type could be approximately 350 ($\mu$m) (micrometers) thick, with the individual diode sites having a center-to-center distance B (FIG. 1) of approximately 65 $\mu$m. The width C of the disposable strip 16, defined between cleavage grooves 18 and 20 could be approximately 500 $\mu$m wide and the distance D between each of such grooves and the center of the adjacent diode site is preferably less than, but in no event greater than half the distance B between the centers of adjacent diode sites. To facilitate scribing the cleavage grooves in the wafer, corresponding channels may be provided in the uppermost layers of wafer material, not shown, as disclosed in detail in my copending U.S. patent Ser. No. 4,997,793, and entitled Method of Improving Cleaving of Diode Arrays.

Because the cleavage groove defining the end face of each LED array chip must be located extremely accurately with respect to the adjacent endmost diode site, it is preferable not to simply provide single straight scribed grooves across the entire wafer, but, rather, as shown in FIG. 1, to scribe individual grooves for each end of each LED array area, originating and terminating in the adjacent sawing streets 14; whereby the required location of each such groove is referenced to fiducial marks on the corresponding array area and minute adjustments of the scribing machine can be performed, as required, for each such groove.

After the scribing operation has been completed, the wafer is attached to a so-called tape frame, which comprises a thin tensioned sheet of adhesively-faced plastic material 26 to which the lower face of the wafer is adhesively adhered. The wafer is then sawed to separate the rows of the array areas, whereupon the tape frame, carrying the separated rows of array areas, is transferred to a cleaving machine.

FIG. 3 illustrates the portion of the wafer shown in FIG. 2 positioned in a typical cleaving machine that clamps the wafer between an anvil 28 below the array area adjacent groove 18 and a resilient pad 30 on clamp member 32. Pressure bar 34 is located above the corresponding disposable strip and is movable downwardly. To cleave the wafer, the pressure bar is driven downwardly, which imparts both a bending force and a sheering force to the wafer, causing it to cleave along a plane defined by groove 18, as shown in FIG. 4. Because the groove 18 is relatively close to the pressure bar, measured along the direction of the rows of array areas, the shearing force, i.e. the force tending to move the disposable strip downwardly relative to the adjacent supported area array, is relatively large compared to the bending forces imposed on the wafer. Accordingly, the cleavage region of the wafer is subject to asymmetrical forces that cause the ledge 36, if any, to occur on the disposable strip 16 as shown in FIG. 4. Although there is no precise limit on the distance separating the pressure bar from the groove along which the wafer is being cleaved, it is preferable that this distance be less than two or three times the thickness of the wafer. The basic principle involved in this technique has previously been employed in the production of glass microtome knives, or the like, as disclosed, for example, in U.S. Pat. Nos. 4,231,503, 4,256,246 and 4,175,684. In those applications, the intent is to establish a curved profile to the fracture to produce a knife-like cutting edge, but the disclosed relationship between the location of the supporting member, the pressure member and the scribed groove is analogous. It should also be understood that other types of cleaving devices can be employed in accordance with the invention; the important consideration being not the means by which cleaving forces are imparted to the wafer, but the fact that such forces are asymmetrical with respect to the cleavage surface such that any deviation of the resulting cleaved chip surface from a plane normal to the wafer surface tends to be toward the chip and away from the disposable strip.

Figure 6:
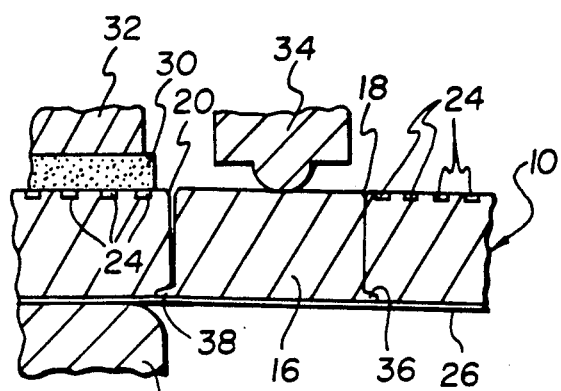
FIG. 6 illustrates the portion of the chip depicted in FIG. 5 after cleaving.

After the wafer material has been fractured along one cleavage groove as shown in FIG. 4, the tape frame is reversed 180° in the cleaving machine, as shown in FIG. 5, so that the other groove 20 is now in the same relation to the cleaving machine elements as was groove 18 in the operation depicted in FIGS. 3 and 4 Accordingly, the downward movement of the pressure bar now fractures the wafer material along the plane defined by groove 20, as shown in FIG. 6, whereby ledges 36 and 38, if any, are both on the disposable strip 16. Obviously, it would not be necessary to reverse the wafer following each cleavage operation, but, rather, all of the cleavage lines along the same side of the respective disposable strips could be cleaved and the tape frame could then be reversed to cleave the wafer along the remaining cleavage lines.

After all of the LED array areas are separated into individual chips, as described above, the tape frame is removed from the cleaving machine and the separated chips and the disposable strip elements are subsequently removed from the tape frame, with the chips being saved for subsequent use and the disposable strip elements being discarded.

Figure 7:
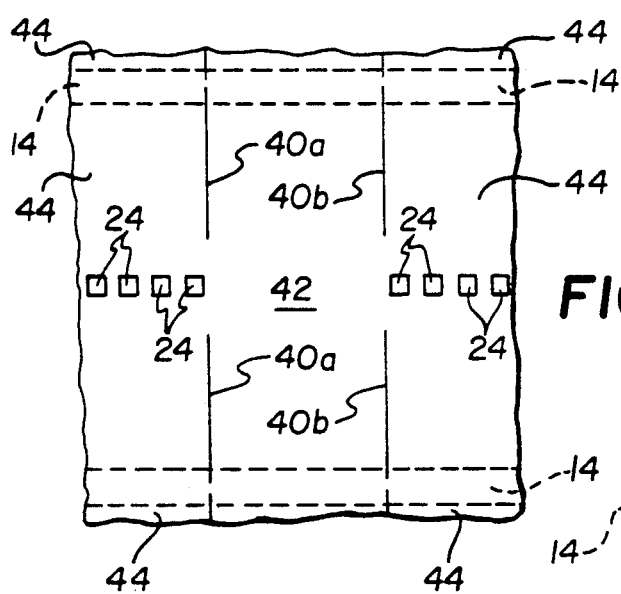
FIG. 7 is an enlarged fragmentary plan view corresponding generally to FIG. 1 but showing an alternate scribing pattern.
Figure 8:
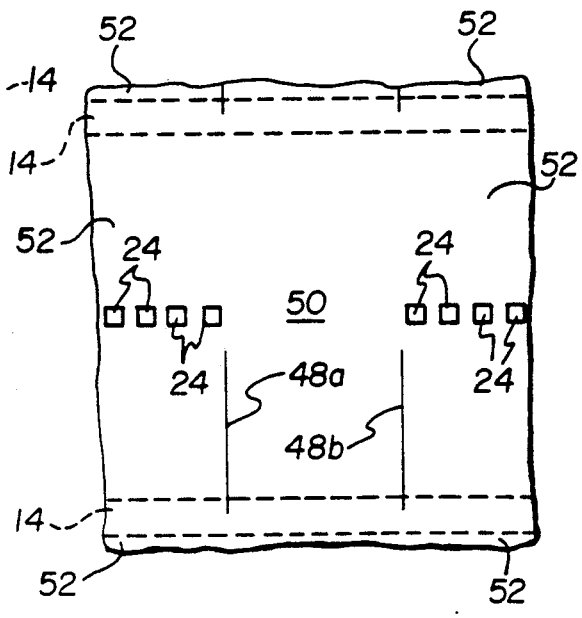
FIG. 8 corresponds to FIG. 7 and shows still another alternate scribing pattern.

FIG. 7 corresponds to an enlarged portion of FIG. 1 and depicts an alternate scribing pattern in which two colinear centrally spaced scribing grooves 40a and 40b define corresponding sides of the disposable strip 42 between each confronting pair of LED array areas 44 and FIG. 8 similarly depicts another embodiment in which each of the scribing grooves 48a and 48b, at each side of the disposable strip 50, extends only partially across the corresponding end of the adjacent array area 52. These embodiments illustrate that, because the wafer tends to cleave along a straight line beyond the end of a cleavage groove, it is not essential that the cleavage groove extend entirely across the LED array area row. Such alternate groove arrangements are disclosed in greater detail in my above-identified U.S. Pat. No. 4,997,793.

Although the invention has been described in the context of producing LED array chips, it is equally applicable to diode array chips wherein the diode sites are light-detecting sites rather than light-emitting sites.

The invention has been described with reference to illustrative preferred embodiments but variations and modifications are possible within the spirit and scope of the invention as defined by the following claims.

What is claimed is:

1. A diode array fabrication wafer having a plurality of diode array areas each of which includes a central row of uniformly spaced diode sites extending between its opposite ends, said diode array areas being arranged on said wafer in multiple rows and columns, said columns being spaced apart between the endmost diode sites of the corresponding diode areas by disposable regions at least as wide as the thickness of said wafer, and wherein a disposable region between endmost diode sites is located between two cleavage grooves.

2. The wafer of claim 1 and wherein the disposable region is about 500 μm wide.

3. The wafer of claim 2 and wherein the thickness of the wafer is about 350 μm.

4. The wafer of claim 3 and wherein a center-to-center distance between uniformly spaced diode sites is about 65 μm.

5. The wafer of claim 4 and wherein an endmost diode site is spaced from one of said cleavage grooves a distance that is not greater than half the distance between centers of adjacent uniformly spaced diode sites.

6. The wafer of claim 1 and wherein an endmost diode site is spaced from one of said cleavage grooves is distance that is not greater than half the distance between centers of adjacent uniformly spaced diode sites.

7. The wafer of claim 1 and wherein the diode sites are light-emitting diode sites.

8. The wafer of claim 1 and wherein the disposable region is of a width substantially greater than a distance between adjacent uniformly spaced diode sites that are in a row.

9. The wafer of claim 5 and wherein the diode sites are light-emitting diode sites.

10. The wafer of claim 8 and wherein the diode sites are light-emitting diode sites.

* * * * *